United States Patent [19]

Rasmusson

[11] Patent Number: 5,777,913
[45] Date of Patent: Jul. 7, 1998

[54] RESOLUTION ENHANCEMENT OF FIXED POINT DIGITAL FILTERS

[75] Inventor: Jim Agne Jerker Rasmusson, Brosarp, Sweden

[73] Assignee: Ericsson Inc., Research Triangle Park, N.C.

[21] Appl. No.: 578,941

[22] Filed: Dec. 27, 1995

[51] Int. Cl.$^6$ .................................................. G06F 17/10
[52] U.S. Cl. ........................................... 364/724.19
[58] Field of Search ................................. 364/724.19

[56] References Cited

U.S. PATENT DOCUMENTS

| | | | |
|---|---|---|---|
| 4,922,530 | 5/1990 | Kenney et al. | 364/724.16 |
| 5,319,585 | 6/1994 | Amrany | 364/724.19 |
| 5,535,150 | 7/1996 | Chiang | 364/724.19 |
| 5,638,311 | 6/1997 | Fujii et al. | 364/724.19 |
| 5,638,439 | 6/1997 | Kawada et al. | 364/724.19 |

FOREIGN PATENT DOCUMENTS

0543568A2   5/1993   European Pat. Off..

OTHER PUBLICATIONS

M. Mohan Sondhi et al., Chapter II of *Adaptive Echo Cancellation* entitled: "Adaptive Echo Cancellation for Speech signals", pp. 327-356.

*Primary Examiner*—David H. Malzahn
*Attorney, Agent, or Firm*—Burns, Doane, Swecker & Mathis, L.L.P.

[57] ABSTRACT

An extended coefficient resolution range is provided in an adaptive filter arrangement by utilizing several filters, in combination, to represent the extended resolution range. The coefficients of a first filter represents a high portion of the extended range, while the coefficients of the second filter represent low portions of the extended range. The two filters operate in parallel to filter an input signal, and the outputs of the filters are combined to produce the filtered signal. A low portion of the coefficients of the first filter overlap an upper portion of the coefficients of the second filter. The coefficients of the first filter are periodically updated from the overlapping portions of the coefficients of the second filter, after which the overlapping portions of the coefficients of the second filter are reset. In accordance with another aspect of the invention, the amount of overlap may be adjusted to dynamically change the resolution range of the filter. The coefficients of the first and second filters are capable of variably overlapping to expand or contract the resolution range in response to changes in the system being monitored. The degree of overlap can also be adjusted to provide an appropriate resolution range corresponding to when the system is stable. An adaptive process is used to update filter coefficients.

25 Claims, 4 Drawing Sheets

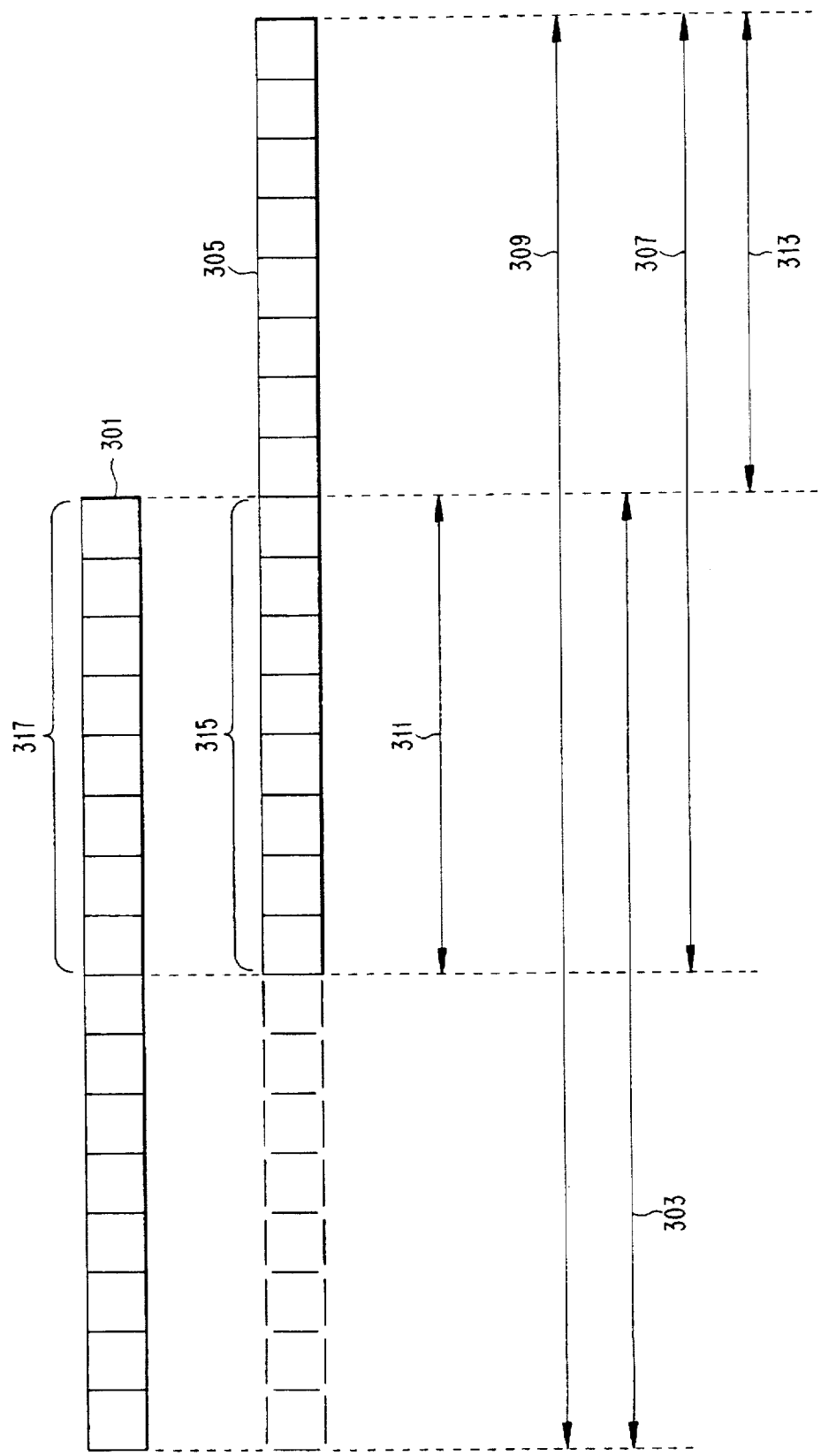

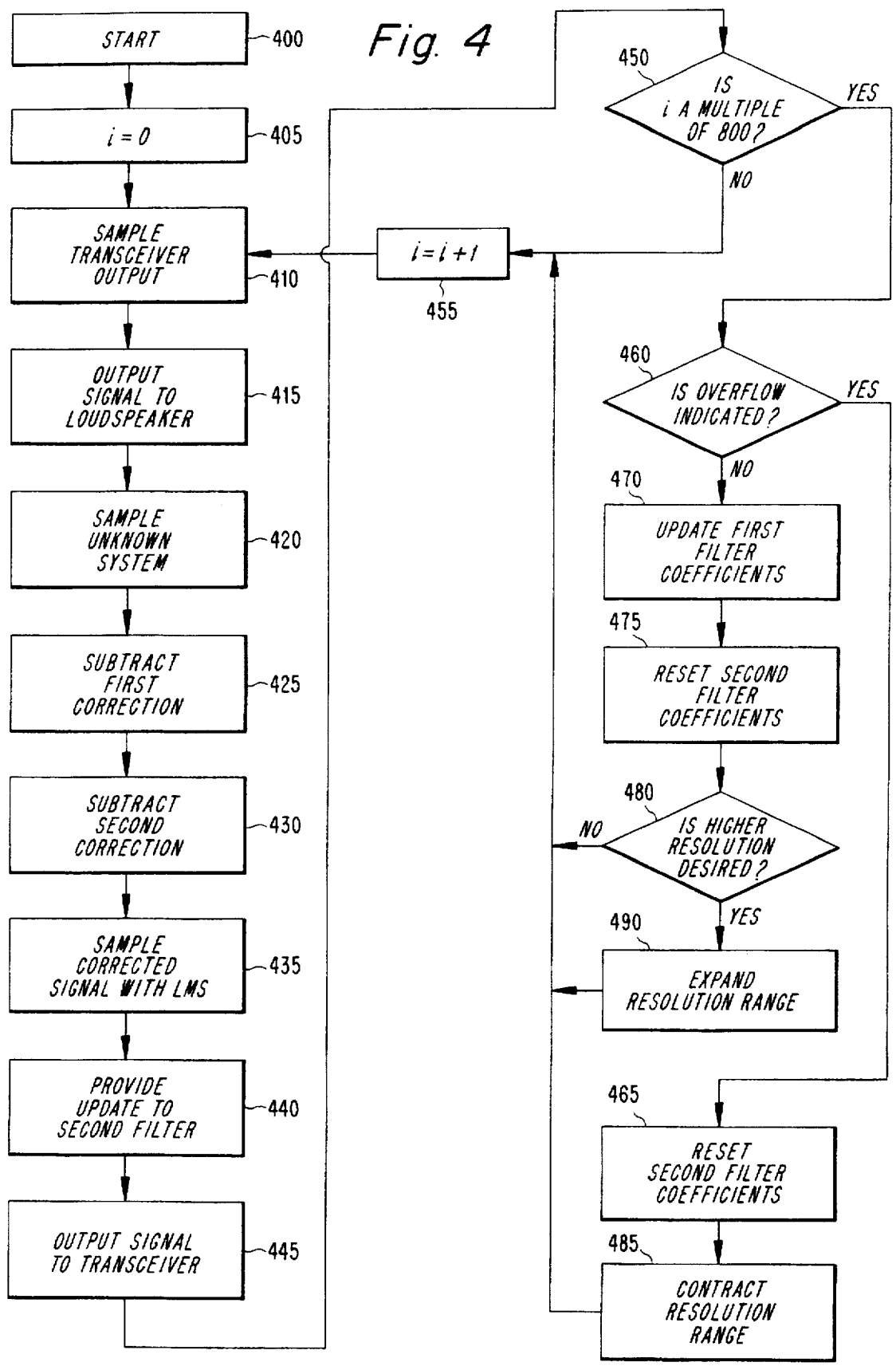

RESOLUTION ENHANCEMENT OF FIXED POINT DIGITAL FILTERS

BACKGROUND

The present invention relates to fixed point digital filters, and, in particular, to the use of two separate lower resolution fixed point digital filters, in combination, to achieve a higher net resolution filter while providing adaptation in both filters.

Digital signal processing is well known as an efficient means for processing analog signals. Digital signal processing typically involves an analog signal being converted into a digital time discrete representation. This is normally done using an analog-to-digital (A/D) converter. The A/D converter operates by sampling and quantizing the analog signal into a sequence of 1s and 0s that represents the original analog signal. Once converted, the digital representation can be subjected to bit processing, such as manipulation by a computer algorithm, that would be difficult if the signal were in an analog format. In addition, digitally formatted signals can be transmitted (perhaps in an encoded state) over a digital channel, and/or processed by high speed digital components. The efficiencies provided by handling signals in a digital format allow for complex signal processing in real-time. In addition, digital components can be used to design systems that are smaller, faster, and lighter than their analog counterparts.

A common application for digital signal processing in a communications setting is echo cancellation processing. Echo signals may be present in a communication signal due, in part, to inherent propagation delays associated with a communications medium, such as a satellite link. In an automotive cellular telephone application, the telephone's microphone might be mounted on a sun visor, or in a like arrangement. Such a microphone, in combination with a remote loudspeaker, either the car stereo's, or a dash-mounted unit, makes it possible for a driver to carry on a conversation without having to hold the cellular unit or its handset; hence the term "hands-free". Hands-free operation is both convenient and enhances driving safety. One problem with hands-free arrangements is a tendency for the microphone to pick up sound from the remote loudspeaker, in addition to the voice of the user. The sound from the loudspeaker may be heard by the individual on the other end of the call (the "far-end user") as an echo of his or her own voice. It is desirable to transmit the near end user's voice signal and to remove the echo signal introduced by the loudspeaker. One solution to this problem is to use an echo cancellation device.

A conventional echo signal cancellation device, in the form of an echo cancellation circuit 100, is depicted in FIG. 1. The echo cancellation circuit 100 is typical of designs directed to ameliorating an echo response produced in a hands-free environment. As shown, the echo cancellation circuit 100 is interposed between a transceiver 110 that communicates with a base station (not shown), and a microphone 105 and loudspeaker 109 arrangement provided to facilitate hands-free communication in an environment, such as the interior of a car, whose affect on an acoustic signal propagating therein is unknown. This type of environment will henceforth be referred to throughout this specification as an unknown system H(z).

An input signal 112, received by the transceiver 110, is converted to a digital format by an analog-to-digital (A/D) converter 142, and the digitized input signal 134 is provided to the echo cancellation circuit 100. The digitized input signal 134 is sampled, within the echo cancellation circuit 100, by a least mean square (LMS) cross correlator 103 and an adaptive finite impulse response (FIR) filter 101, before being output to a digital-to-analog (D/A) converter 136, and then to an amplifier 138 prior to provision to a loudspeaker 109. An audio signal 115 containing the far-end user's voice is introduced to the unknown system H(z) by the loudspeaker 109. A signal 120, generated by the microphone 105, is amplified by amplifier 122 and converted to a digital format by A/D converter 124. The digitized microphone signal 126 is provided to the echo cancellation circuit 100 for echo cancellation processing. Following echo cancellation processing, an error signal 107 is provided to a D/A converter 132 whose output is provided to the transceiver 110 for broadcast.

The filter 101 is a finite impulse response filter that receives coefficient updates from a least mean square (LMS) cross correlator 103. The LMS cross correlator 103 generates an update signal 130 which is used to update the coefficients of the FIR filter 101. The update signal 130 is calculated based, in part, upon samples of digitized input signal 134, and samples of a error signal 107. Operation of the LMS cross correlator is discussed in greater detail below. The finite impulse response filter 101 generates an echo estimate signal 102 (commonly referred to as a û signal) that is a convolution of digitized input signal 134, and a sequence of i filter weighting coefficients ($h_i$ maintained within the filter 101 (See Equation 1).

$$\hat{u}(n) = \sum_{i=0}^{m-1} h_i x(n-i) \qquad \text{Equation 1}$$

where x(n) is the input signal, m is the number of weighting coefficients, and n is the sample number.

Typically, 200 to 400 weighting coefficients (hereinafter referred to as "coefficients") are required for effectively canceling an echo in a hands-free environment. When the coefficients are set correctly, the filter 101 produces an echo estimate signal 102 that is approximately equal to that of a corresponding echo signal from unknown system H(z) between the loudspeaker 109 and the microphone 105. The echo estimate signal 102, generated by the FIR filter 101, is subtracted from the digitized microphone signal 126 (designated u(n) in Equation 2) at a summation point 128, to produce an error signal 107 (designated e(n) in Equation 2) that is output from the echo cancellation circuit 100.

$$e(n) = u(n) - \hat{u}(n) \qquad \text{Equation 2}$$

Ideally, any echo signal from the unknown system H(z), originating from the loudspeaker 109, is removed from the digitized microphone signal 126 by the subtraction of the echo estimate signal 102.

It can be seen that the effectiveness of the echo canceler is directly related to how well the filter 101 is able to replicate the echo response of the unknown system H(z). This, in turn, is directly related to the set of coefficients, $h_i$, maintained by the filter 101.

It is advantageous to provide a mechanism for dynamically altering the coefficients, $h_i$, to allow the filter 101 to adapt to changes in the unknown system H(z), such as those that occur when a window or car door is opened or closed in a car having a hands-free arrangement.

A well-known coefficient adaptation scheme is the Least Mean Square (LMS) process, which was first introduced by Widrow and Hoff in 1960, and is frequently used because of its efficiency and robust behavior. As applied to the echo cancellation problem, the LMS process is a stochastic gradient step method which uses a rough (noisy) estimate of the gradient $g(n)=e(n)x(n)$ to make an incremental step toward minimizing the energy of an echo signal in a microphone signal, $e(n)$, where $x(n)$ is in vector notation corresponding to an expression $x(n)=[x(n)x(n-1)x(n-2) \ldots x(n-m+1)]$. The update information produced by the LMS process, $e(n)x(n)$, is used to determine the value of a coefficient in a next sample. The expression for calculating a next coefficient value $h_i(n+1)$ is given by:

$$h_i(n+1)=h_i(n)+\mu e(n)x(n-i), i=0 \ldots m-1 \qquad \text{(Equation 3)}$$

where $x(n)$ is the digitized input signal 134,
$(h_i)$ is a filter weighting coefficient,
i designates a particular coefficient,
m is the number of coefficients,
n is the sample number, and
μ is a step or update gain parameter.

The LMS method produces information in incremental portions each of which can have either a positive or negative value. The information produced by the LMS process can be provided to a filter to update the filter's coefficients.

Referring back to FIG. 1, the adaptation mechanism in the echo cancellation circuit 100 is a LMS cross correlator 103. The LMS cross correlator uses the sample taken from the digitized input signal 134 as a reference signal, and the sample taken from the error signal 107 to produce the update signal 130. Because coefficients of the filter 101 can only accommodate limited resolution (e.g., 16 bits), the update signal 130 is typically truncated or rounded by a rounding unit or truncator 106 to discard a least significant portion of the update signal 130. LMS update information 104 is accumulated in the coefficients $h_i$ of the filter 101. The echo estimate signal 102, provided by the filter 101, is a function of the coefficients, $h_i$.

Use of an adaptive echo cancelling arrangement involves an initial learning period during which time the coefficients of filter 101 are modified so as to cause the filter 101 to model the echo component present in the digitized microphone signal 126. During the initial learning period, performance of the echo cancellation circuit 100 is less than optimal because an echo component is not substantially eliminated from an input signal. Once the echo cancellation circuit 100 has substantially learned the echo response of the unknown system $H(z)$, thereby canceling an echo component from the digitized microphone signal 126, the arrangement is said to have "converged." Once converged, the arrangement continues to incrementally adjust and compensate for changes in the unknown system $H(z)$.

It is relatively simple to design signal processing systems with off-the-shelf components specifically conceived for use with digitally formatted signals. One such component is the aforementioned FIR filter. Off-the-shelf digital filters are commonly of a 16-bit variety. That is, each of the filter's coefficients is represented by a sequence of 16 bits. Conventional digital signal processing designs such as the one depicted in FIG. 1 are almost exclusively represented by commercially available 16-bit fixed point filters. The drawback in using 16-bit components is their limited resolution. Because only 16 bits are provided for each weighting coefficient, such filters may not provide the requisite precision to be completely effective in cancelling an echo component from a signal. For many applications, 16-bit resolution is sufficient; however, when higher resolution is desired or necessary, the conventional solution has been to provide a double precision arrangement. However, double precision arrangements require significant processing power to handle the corresponding increase in required calculations.

Generally, the filter 101 depicted in the conventional arrangement of FIG. 1 is a 16-bit filter. However, the LMS cross correlator 103 typically provides update information in a 32-bit format. Consequently, a 32-bit LMS update information sequence is usually truncated, or rounded (hereinafter truncated) by a rounder, or truncator 106 to provide the most significant 16 bits. The purpose of truncation is to conform the LMS cross correlator update information to the 16-bit coefficient format of conventional digital filters. As a result, a coefficient having a weighting value of, for example, 24680BDFH in 32-bit hex representation, is only represented by 2468H in a (truncated) 16-bit hex representation. The finer resolution weighting portion of 0BDFH is discarded.

Most of the commercially available DSPs (and CPUs) on the market use signed binary twos-complement number representation. The bits are in the format:

SVVV VVVV VVVV VVVV where S is the sign bit (0 means positive number and 1 means negative) and V are value bits. For example, the decimal number of 55 is represented as 0000 0000 0011 0111 and −55 (negative) is represented as 1111 1111 1100 1001

(note that the sign bit is a 1).

The foregoing format normally represents integer numbers between −32768 and +32767 (16 bit signed 2's complement). To be able to represent fractional numbers (which are typically involved in DSP calculations), there must be a radix point which, for binary numbers, is sometimes referred to as a binary point. The binary point in a DSP is usually placed immediately after the sign bit:

S.VVV VVVV VVVV VVVV (16 bit), and

S.VVV VVVV VVVV VVVV VVVV VVVV VVVV VVVV (32 bit).

The corresponding decimal numbers that can be represented range from −1 to just under +1, signed. The decimal number of 0.5 is represented with 0100 0000 0000 0000 (16 bit signed twos-complement). The value 0.25 (decimal) is 0010 0000 0000 0000, and the value 0.125 (decimal) is 0001 0000 0000 0000. Note the decreasing value of the "value" bits as you go to the right (for each step to the right they decrease by a factor of 2, i.e., ½, ¼, ⅛ . . . ).

The previous example of 24680BDFH (Hex, 32 bits), when representing a signed twos-complement number having a binary point to the right of the sign bit, corresponds to the decimal number 0.2844252432696521282196044921875. If truncated to 2468H (Hex, 16 bits) the resulting decimal number would be decimal 0.284423828125. The less significant part 0000 0BDFH (corresponding to 0.00000141514465212821960044921875) is truncated or rounded away. In this case, truncation and rounding produce the same results.

A conventional arrangement's echo cancellation capability is limited by the truncation of LMS update information. As a consequence, the high resolution, or fine components of an echo signal cannot be modeled by the filter 101. Discarding this information precludes its use for modeling fine components of the echo signal, allowing these components to be provided to the transceiver 110 as an undesired echo signal. Thus, the conventional arrangement's ability to eliminate the echo component is limited to low resolution portions, resulting in incomplete mitigation of an echo component.

SUMMARY

It is an object of the present invention to provide a method and an apparatus which provides a high resolution adaptive filtering without having to rely on double precision processing.

It is a further object of the present invention to provide a method and apparatus for providing a dynamically adjustable resolution range in a filter arrangement.

An exemplary system in accordance with the invention provides an enhanced resolution fixed point adaptive digital filter arrangement having at least two digital filters, wherein coefficients of each filter represent resolution ranges which are used in combination to represent an extended resolution range that is collectively greater than that of either filter individually.

In accordance with one aspect of the invention, the coefficients of the filters overlap wherein a degree of overlap can be dynamically adjusted to expand or contract adjustable resolution. Coefficients of a first filter represent an upper portion (coarse component) of the dynamic resolution range, while coefficients of a second filter represent a lower portion (fine component) of the dynamic extended resolution range. An overlapping portion represents a same resolution range.

In operation, coefficients of the second filter are updated with information from an adaptation process, such as an LMS cross correlator. When operating in accordance with a preferred embodiment overlapping coefficients of the first filter are periodically updated with the overlapping coefficients of the second filter after which the overlapping coefficients of the second filter are reset.

An arrangement in accordance with another aspect of the invention resists an overflow condition in the second filter when an update signal has an amplitude that is larger than the second filter can presently handle. This is achieved by changing the resolution range of the second filter by adjusting the degree of coefficient overlap, and/or by adjusting the period for coefficient update. By performing one or more of these steps, the second filter coefficients are more likely to be receptive to updates from the adaptation process without overflow occurring.

An exemplary system in accordance with the invention involves the use of two adaptable filtering means, in combination, to provide filtered signals which, combined, provide a higher degree of resolution than would ordinarily be provided by either filtering means operating alone. The filtered signals provided are convolutional sums of an input signal and coefficients of the filtering means. Coefficients of the first filtering means represent one portion of an extendable resolution range. Coefficients of the second filtering means represent a second portion of the extendable resolution range. The two portions can adjustably overlap. In an exemplary embodiment, the second filtering means receives updates from an adaptation process. Periodically the second filtering means transfers coefficients representing the overlapping portion of the resolution range to update the overlapping coefficients of the first filtering means. When completely overlapped, all of the coefficients of the first filtering means coefficients can be updated. When partially overlapped, only the overlapping coefficients are updated. By shifting the coefficients of the second filtering means, the second filtering means can be utilized to represent a higher resolution portion thus extending the resolution range. However, this involves scaling high resolution adaptation information, by amplifying or shifting, in order to represent the high resolution information in the coefficients of the second filtering means. Accordingly, the second filtering mean's output must be scaled to bring it back into its original range.

BRIEF DESCRIPTION OF THE DRAWINGS

The foregoing, and other objects, features and advantages of the present invention will be more readily understood upon reading the following detailed description in conjunction with the drawings in which:

FIG. 3 depicts an overlapping coefficient resolution range of two FIR filters to provide a dynamic extended resolution range in accordance with the invention; and FIG. 4 illustrates a flowchart of a method in accordance with the invention.

DETAILED DESCRIPTION

The following detailed description of a system incorporating the invention is provided in the context of an echo canceler suitable for use in a hands-free communications environment. The description is merely illustrative and should not be construed as limiting to the applications to which the invention can be applied.

Figure 2:
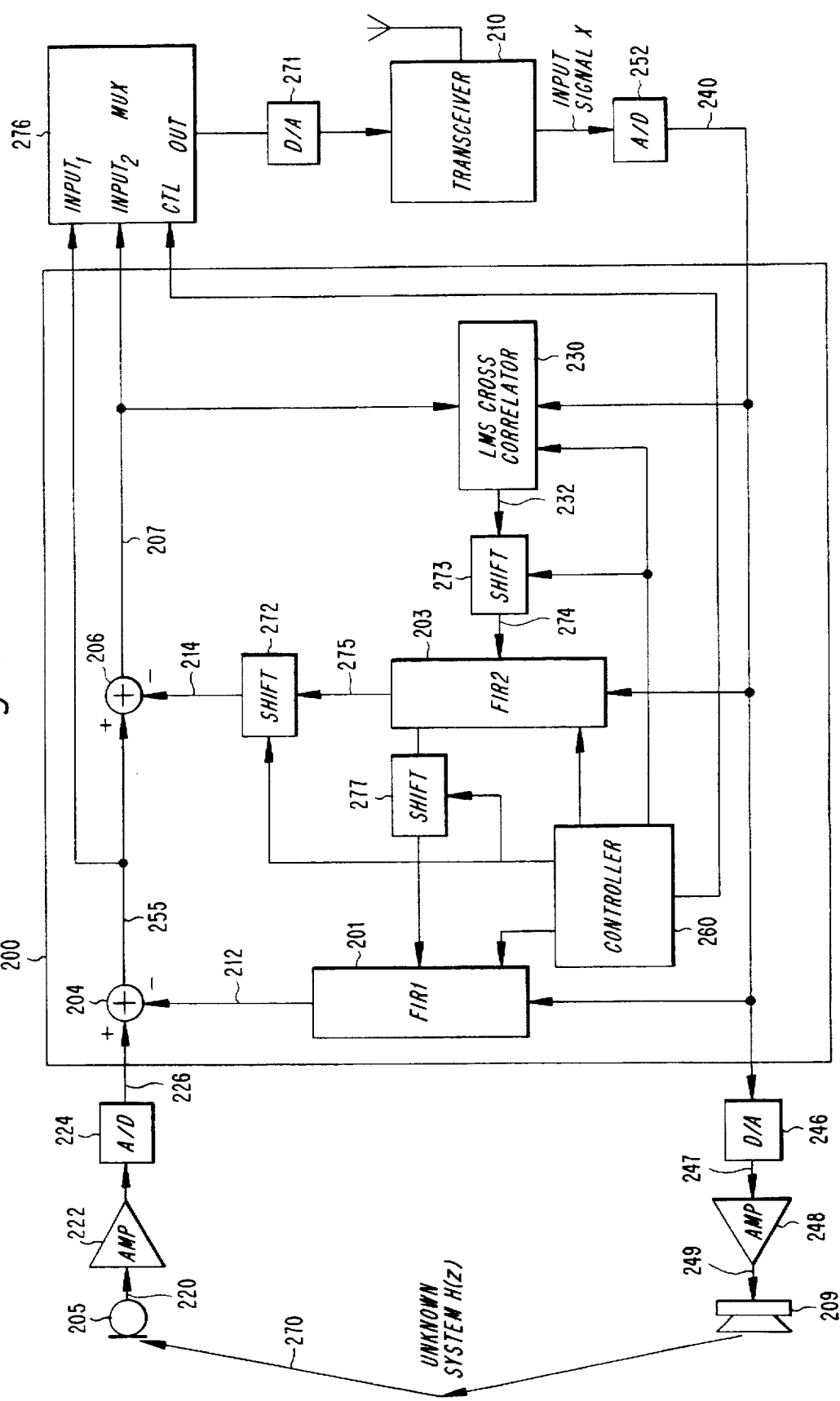
FIG. 2 depicts an arrangement including a preferred embodiment of the invention.

An arrangement including a preferred embodiment of the invention is shown in FIG. 2. In the depicted arrangement, separate resolution ranges represented by coefficients of a first and a second 16-bit filter 201 and 203 are combined to represent an extended filtering range. An input signal x (e.g., a voice signal from a far-end user), received by the transceiver 210, is converted to a digital format by an A/D converter 252 to provide digitized input signal 240. The digitized input signal 240 is sampled within an echo cancellation circuit 200 by each of an LMS cross correlator 230, a second filter 203 (FIR2), and a first filter 201 (FIR1). The digitized input signal 240 is output from the echo cancellation circuit 200 to a D/A converter 246 which provides output 247 to an amplifier 248 which, in turn, outputs a signal 249 to a loudspeaker 209. The unknown system H(z) receives acoustic input from the loudspeaker 209. Microphone 205 samples audio signals from the unknown system H(z) to generate a microphone signal 220. The microphone signal 220 typically is amplified by an amplifier 222 and converted to a digital format by an A/D converter 224 to produce a digitized microphone signal 226. Audio signals sampled from the unknown system H(z) (i.e., digitized microphone signal 226) may contain both a desired signal component (e.g., the voice of a user) in addition to an undesirable audio signal 270 from the loudspeaker 209. The loudspeaker audio signal 270 when picked up by the microphone 205 may be perceived by a far-end user as an echo of his or her own voice.

The circuitry in the echo cancellation circuit 200 is provided to remove an echo signal introduced by the loudspeaker 209. Such circuitry, in accordance with a preferred embodiment, can be provided in the form of a digital signal processor, wherein the first and second filters 201 and 203 are finite impulse response (FIR) filters. However, an arrangement in accordance with the invention can alternatively involve digital infinite impulse response (IIR) filters, or any other digital filters whose coefficients can be adaptively modified.

Figure 1:
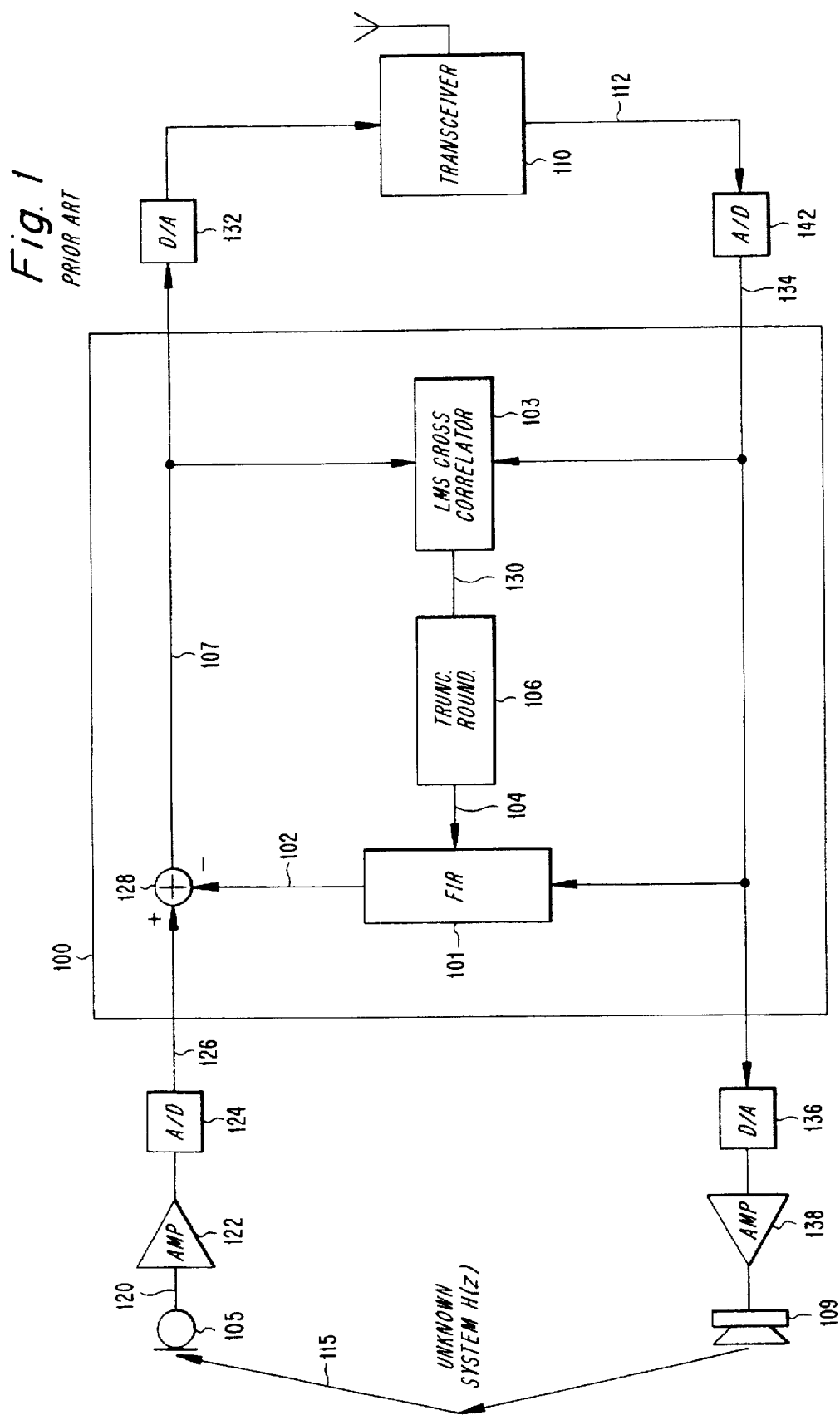
FIG. 1 depicts a conventional arrangement having a single FIR filter and an LMS adaptation mechanism.

It will be appreciated that a digital filter includes means, such as registers, for storing coefficients. During signal processing, each coefficient is multiplied by a possibly delayed version of an input signal sample. The resulting products are combined in some fashion to produce the filtered signal. The prior art filter 101 (see FIG. 1) is limited in its precision by the size of the registers that hold its coefficients. For example, if thirty-two bit coefficients are available, but the filter 101 only has 16-bit registers, then the low-order sixteen bits of each coefficient need to be truncated before being stored in the filter 101.

The present invention overcomes this drawback by recognizing that each coefficient may be represented as a sum of two numbers. Let 2R represent the amount of precision of an available coefficient, where precision of a number is measured by the number of bits that represent that number. Then, assuming that the radix (binary) point is located just to the right of the sign bit, S, the coefficient may be represented by the equation:

$$\begin{aligned} \text{Coefficient} &= -S + (A*2^R + B*2^{overlap})*2^{-(2R-1)} \\ &= -S + A*2^R*2^{-2R+1} + B*2^{overlap}*2^{-2R+1} \\ &= -S + A*2^{-R+1} + B*2^{-2R+overlap+1} \end{aligned}$$

where:

A is an (R-1)-bit wide integer,

B is an R-bit wide integer, and overlap is an integer variable representing the extent to which the most significant bits of the integer B are to have the same significance as the least significant bits of the integer A. When overlap equals 0 there is no overlap, and when overlap equals R there is complete overlap.

Thus in accordance with one aspect of the invention, each filter coefficient is represented by a sign bit (S), an A part and a B part. For each coefficient, the sign bit, S, and the A part are stored together in an R-bit wide register in the first filter 201, and the B part of each coefficient is stored in an R-bit wide register in the second filter 203. Although the B part of the coefficient is conceptually of lower significance by an amount R-overlap, the second filter 203 behaves as though the radix (binary) point were located just to the right of the most significant bit of the number B. In order to properly scale the filtered signal emanating from the second filter 203, the output must be multiplied by $2^{-R+overlap}$. This may be easily accomplished by means of the second shift register 272 as shown in FIG. 2. This scaled output may then be combined (e.g., summed) with the output of the first filter 201 to produce a net effect of a single filter whose precision (i.e., the number of bits available for representing a coefficient) is 2R-overlap. Since the actual precision of the first filter 201 is only R, the precision of the filtering as a whole has been extended (referred to herein as an "extended resolution range") by an amount R-overlap. The application of these principals are set forth in further detail in the following descriptions of the various embodiments.

Returning to the exemplary application depicted in FIG. 2, the first filter 201 provides a first echo estimate signal 212 that is subtracted from the digitized microphone signal 226 at a first summation point 204 to provide a first error signal 255. The first error signal 255 is supplied to an input of a second summation point 206, where a second echo estimate signal 214, supplied by the second filter 203 and scaled by a second shift register 272, is subtracted to produce a second error signal 207. Ordinarily, the second error signal 207 is output from the echo cancellation circuit 200 and supplied to an input port (input$_2$) of a multiplexor 276. As explained in greater detail below, the multiplexor 276 can be controlled to output the second error signal 207 to a D/A converter 271 for conversion to an analog format which analog signal is then provided to the transceiver 210. It will be appreciated by one skilled in the art that the outputs 212 and 214 of the first and second filters 201, 203 can alternatively be added together to provide a combined signal that is subtracted from the digitized microphone signal 226.

In order to adaptively update coefficients of the filters 201 and 203, an LMS cross correlator 230, operating in accordance with known techniques, samples the second corrected signal 207 in addition to the digitized input signal 240. Update information 232 supplied from the LMS cross correlator 230 is used to update the coefficients of the second filter 203. Periodically, the second filter 203 supplies its overlapping coefficients to update the overlapping coefficients of the first filter 201. As explained in greater detail below, unnecessary truncation of the LMS cross correlator output can be avoided by utilizing a first adjustable shift register 273 for processing the update information 232 from the LMS cross correlator 230; and second and third adjustable shift registers 272 and 277 for scaling the second echo estimate signal 214 and shifting coefficient data from the second filter 203, respectively.

A graphic representation illustrating an exemplary resolution configuration using 16-bit filters is shown in FIG. 3. In the depicted configuration, the coefficients 301 of the first filter 201 represent a most significant portion 303 of an extended resolution range 309. Coefficients 305 of the second filter 203 represent a least significant portion 307 of the extended resolution range 309. In the exemplary configuration, the extended resolution range consists of 24 bits wherein there is an overlap 311 of eight bits and an offset 313 of eight bits.

In accordance with another aspect of the invention, the extended resolution range 309 can be dynamically expanded or contracted to change the amount of low magnitude signal information represented by the second filter 203. Adjustment of the extended resolution range will alter the overlap 311 and the offset 313. Consequently, the degree of shifting and scaling performed by the shift registers 272, 273, 277 is adjusted accordingly. When the coefficients represent twos-compliment numbers, the coefficient overlap 311 should be at least two bits.

A process of operating the apparatus of FIG. 2 in accordance with the invention is illustrated by the flowchart of FIG. 4. Signals for controlling the apparatus of FIG. 2 in accordance with the method illustrated in FIG. 4 can be generated by a controller 260. The controller 260 communicates with the first and second filters 201 and 203, the LMS cross correlator 230, the first, second and third shift registers 273, 272 and 277, and the multiplexor 276. The controller 260 can be in the form of a circuit or processor program that is provided in an on-, or off-board DSP controller. The controller 260 facilitates operation of the echo cancellation circuit 200 by administering the transfer of information, expansion and contraction of the extended resolution range, timing, transfer rates, shift register control, and I/O functions. One skilled in the art will readily be able to design a controller that operates as described herein. In the description of the exemplary method that follows, a sampling rate for the echo cancellation circuit 200 is 8000 samples per second.

Referring back to FIG. 4, a new sampling period begins at block 405 by resetting a sample cycle counter, i, to zero. The digitized input signal 240 from the transceiver 210 is sampled (block 410) by each of the LMS cross correlator 230, the second filter 203, and the first filter 201. The digitized input signal 240 is then converted back to analog by D/A converter 246, amplified by the amplifier 248, and supplied to the loudspeaker 209 (block 415) that generates an audio signal in the unknown system H(z).

The microphone 205 samples an audio signal from the unknown system H(z) (at block 420). The sampled signal 220 generated by the microphone 205 may contain both a user's voice signal, and the audio signal 270 from the loudspeaker 209. The signal 220 is appropriately amplified and converted from analog to digital form to produce the digitized microphone signal 226. At block 425, the first echo estimate signal 212 is subtracted from the digitized microphone signal 226 to produce the first error signal 255. At block 430, the second echo estimate signal 214 is subtracted from the first error signal 255 to produce the second error signal 207. The second corrected signal 207 is sampled by the LMS cross correlator 230 at block 435. At block 440, the LMS cross correlator 230 provides an update information signal 232 which is appropriately amplified (see below) by the first shift register 273 to produce adjusted update information signal 274 which is supplied to the second filter 203 for updating of its coefficients. Concurrent with the sampling by the LMS cross correlator 230, the second corrected signal 207 is output to the multiplexor 276 and may then be provided to the D/A converter 271 and converted from digital to analog form by D/A converter 271. The analog signal is then supplied to the transceiver 210 (block 445).

The sample cycle counter, i, is next checked (block 450) to see if the sampling cycle number indicates whether periodic updating of overlapping coefficients of the first filter 201 by overlapping coefficients of the second filter 203 is appropriate. In a preferred embodiment, this check occurs every 100 milliseconds (msec). Hence, the sample cycle counter, i, is checked to see if it is a multiple of 800 (at decision block 450). If the sample cycle counter, i, is not a multiple of 800, the sampling process continues at block 455 by incrementing the counter i and returning to block 410 to continue operation as previously described.

If a multiple of 800 sample cycles have been performed, the second filter 203 is first checked for an overflow condition (block 460). Overflow can be determined if the maximum coefficient value which can be maintained by the coefficients of the second filter 203, for a given overlap configuration, is exceeded. If embodied in a digital signal processor, overflow can be indicated by a set overflow flag. If an overflow condition exists, the coefficients of the second filter 203 are reset (discarded) at block 465 and the degree of resolution can be adjusted, if desirable, to prevent the overflow from reoccurring. Such an adjustment involves increasing the number of significant bits transferred by the second filter 203, thereby decreasing the effective resolution range of the echo canceler as a whole. In a preferred embodiment, this is accomplished by incrementally increasing the amount of coefficient overlap (see block 485) by one bit for each 800 samples until overflow is no longer indicated. Increasing the overlap requires a corresponding decrease in the amount shifting performed by the first, second and third shift registers 273, 272 and 277.

As a consequence of the increased overlap, a greater amount of coarse echo information is transferred to the overlapping resolution range of the first filter 201 in subsequent cycles. After the overlap is adjusted, if desired, the sample cycle counter is incremented (block 455) after which the sampling process continues at block 410 as previously described. After 8000 samples are completed, the process begins again at block 405.

It is noted that the likelihood of overflow can be further reduced by decreasing the update period, that is, the period between updates of the first filter 201. In FIG. 4, this would entail decreasing the sample counter check value (i.e., 800) in decision block 450 to a smaller value.

Returning now to FIG. 4, in the event that overflow is not indicated at decision block 460, the overlapping coefficients of the second filter 203, scaled by the third shift register 277 in accordance with the degree of resolution range extension, are added to the overlapping coefficients of the first filter 201 (block 470). The overlapping coefficients of the second filter 203 are then reset (to zero) leaving the non-overlapped coefficients of the second filter 203 intact.

A determination is then made (at decision block 480) whether it would be desirable to expand the resolution range in order to model a greater number of fine resolution echo signals. This determination depends, in part, on whether the arrangement is sufficiently stable. Stability of the arrangement can be indicated by a low energy level in the coefficients of the second filter 203, or by the lack of an overflow condition in the second filter 203 when checked at block 460. If deemed suitably stable, the dynamic extended range can be expanded by decreasing the coefficient overlap of the first and second filters 201 and 203 (at block 490). Such resolution increase can be achieved by downshifting the coefficients of the second filter 203 by one or more bits. After the adjustment, the sample cycle counter is incremented at block 455 and the process continues at block 410. If it is not desirable to expand the range, the process simply increments the sample cycle counter at block 455 and continues at block 410 as previously described. Convergence can occur when the arrangement is sufficiently stable. That is, when the unknown system does not significantly change thereby allowing the first and second filters 201 and 203 to achieve an optimum setting for a given resolution level. If the arrangement is converged, and not at a highest resolution level, the coefficients of the second filter 203 can be shifted to achieve a higher resolution.

Determination of when it is appropriate to expand or contract the resolution range can depend on the stability of the filtering arrangement. As described above, an overflow flag can be indicative of an overflow state in the coefficients of the second filter 203. In such a situation it may be appropriate to contract the resolution range. Conversely, comparison of a measured adaptation amount with a predetermined value may indicate that it is appropriate to expand the resolution range. In an alternative arrangement, a timer can be used to expand a resolution range after a predetermined amount of time. This may be appropriate when a filtering arrangement incorporating the invention is used in a relatively well known setting wherein the amount of time it ordinarily takes for the filtering arrangement to sufficiently adapt is known. Another technique for determining whether the filtering arrangement has stabilized to an acceptable extent is to utilize a convergence gauging method or apparatus as described in the U.S. patent application Ser. No. 08/578,944 entitled "Gauging Convergence of an Adaptive Filter" by Jim Rasmusson, filed on Dec. 27, 1995 and incorporated herein by reference in its entirety.

Measurement of a filtering arrangement's convergence state by means of the techniques described in the incorporated document cited above, can involve a comparison of the second filter's energy, level or power of coefficients at the end of a convergence determination period, with a normalizing value for the same period. Such a normalizing, or baseline, value can be the energy, level or power of an accumulated value of the digitized input signal 240 over the convergence determination period. In accordance with a preferred embodiment of the present invention, only overlapped coefficients of the second filter 203 are provided for the comparison.

In accordance with another aspect of the invention, it may be preferable to output the better of the first error signal 255 or the second error signal 207 in situations where the LMS process provides update information that causes the second filter 203 to overflow. Referring back to FIG. 4, in the event of an overflow indication at decision block 460, it may be beneficial to choose the first error signal 255, rather than the second error signal 207 for output to the multiplexor 271. Such an overflow check can, for example, be indicated by a set overflow flag. An overflow state means that the coefficients of the second filter 203 are erroneous. Consequently, the second echo estimate signal 214, subtracted from the first error signal 255, results in the second error signal 207 being less desirable for transmission to the far end user than the first error signal 255. Hence, it may be desirable to output the first error signal 255 in such situations. In such a case, the controller 260 can control the MUX 276 to output the first error signal 255 to the D/A converter 271 for conversion and output to the transceiver 210. Normally, the second error signal 207 will be better than the first error signal 255 because of the further subtraction of echo estimate signal 214. Additionally, in the event that coefficients of the second filter 203 overflow, it may be advantageous to discard them (i.e., reset them), without updating the coefficients of the first filter 201 (see decision block 465 of FIG. 4).

In operation, the first filter 201 functions to eradicate the coarse, or low resolution portions of an echo component in the digitized microphone signal 226. The first filter 201 does so by generating the first echo digitized signal 212 which, when subtracted from the digitized microphone signal 226, produces first corrected signal 255. The second filter 203 operates to eradicate the finer, or high resolution echo components which remain in the first corrected signal 255.

Typically, if an echo component is weak, it may be effectively removed by the cancellation provided by the second filter 203 alone. However, if the echo signal becomes substantial, coefficients of the second filter 203 may overflow in which case the echo cancellation output of the second filter 203 may not adequately ameliorate the echo. To address this problem, the arrangement should initially operate in a highly overlapped state. That is, during initial operation, the second filter 203 should be configured to utilize more of the most significant bits of the LMS update information 232, with a large amount of coarse correction information being provided by the overlapped coefficients of the second filter 203 to the overlapped coefficients of the first filter 201. As the arrangement learns and eradicates the echo response of the unknown system H(z) the arrangement will typically stabilize, and the magnitude of LMS updates will become smaller. Lower level LMS update information is less likely to overflow the coefficients of the second filter 203. Once stable, the resolution range of the arrangement can be increased. This is done by downshifting the resolution range of the second filter 203 relative to the resolution range of the first filter 201. Once adjusted in this manner, the information represented by the second filter 203 can correspond to finer echo signal components which can be accordingly modeled and eliminated.

In accordance with another aspect of the invention, down- and upshifting of the resolution range of the second filter 203 entails adjustably up-shifting the LMS update information signal 232 (via the first shift register 273), while simultaneously down-shifting, and thus attenuating the echo estimate signal 275 of the second filter 203. Additionally, overlapped coefficient weighting values that are transferred from the second filter 203 to the first filter 201 also require corresponding down-shifting, by means of the third shift register 277, in order to put them back into the proper range for use by the first filter 201. Amplification and attenuation are provided by first and second adjustable shift registers 273 and 272, respectively, to produce adjusted update information signal 274 and the second echo estimate signal 214. The amount of up- and down-shifting varies according to the degree the coefficients of the first and second filters 201 and 203 are offset. The term "degree of offset" is used here to mean an amount (number of bits) that the coefficients of the second filter 203 are downshifted relative to the coefficients of the first filter 201 (see offset 313 in FIG. 3).

When the filter arrangement is configured (i.e., offset is selected) to represent high resolution information, the coefficients of the second filter 203 are dedicated to representing high resolution components of echo information provided by the LMS cross correlator 230. Accordingly, the first shift register 273 is adjusted to amplify, or upshift, the LMS update information 232 into the resolution range represented by the coefficients of the second filter 203. Since this causes the output of the second filter 203 to be amplified by an amount corresponding to the amount of amplification or upshifting, a corresponding attenuation, or downshift, must be performed on the echo estimate signal 275 to bring it back into the proper range. Similarly, the coefficients supplied by the second filter 203 to the first filter 201 must be downshifted to put them into the proper bit positions for use by the first filter 201. The amount of amplification/attenuation (upshift/downshift) is variable depending on the resolution range represented.

In a preferred embodiment, the amplification/attenuation corresponds to a ±6 dB adjustment per bit of offset. Adjustment of the LMS information update information 232 for the extended resolution range represented by the coefficients of second filter 203 is performed using the first shift register 273.

For the exemplary configuration illustrated in FIG. 3, wherein there is an eight bit extension of the resolution range (offset 313), update information 232 from the LMS cross correlator 230 is up-shifted eight bits in correspondence with the eight bit offset 313. This adjustment results in a +48 dB amplification (i.e., +6 dB per bit of upshift) of the LMS update information signal 232. If the extended resolution range were increased by extending the resolution range by one more bit (i.e., a nine bit offset), the amplification provided by first shift register 273 would be +54 dB.

Once adjusted, the update information 274 is used to modify the coefficients of the second filter 203. The echo estimate signal 275 of the second filter 203 is accordingly adjusted, or down-shifted, by the second shift register 272 to provide a second echo estimate signal 214 that is at a correct level.

The dynamic shifting nature of the extended resolution range is exemplified by examining the echo cancellation circuit 200 during initial operation. Initially, the resolution ranges represented by the coefficients of each filter are substantially, if not completely, overlapped. The coefficients of the first and second filters 201, 203, in an initial state, are reset to zero and consequently provide no cancellation signals. As communication occurs between the user in the hands-free environment (i.e., the unknown system H(z)) and a far-end user (via the transceiver 210), the filters 201, 203 begin to receive and generate signals accordingly.

Initially, the digitized microphone signal 226 collected from the unknown system H(z) passes, unmodified, through summation points 204 and 206 as the filters initially generate zero-magnitude signals. The LMS cross correlator 230, consequently, samples a full echo component in the second error signal 207. The LMS cross correlator 230 provides an update signal 232 which is adjusted by the first shift register 273 according to the degree of resolution range extension. The adjusted update information 274 is provided to the second filter 203 which updates its coefficients accordingly. It will be appreciated that when there is complete overlap in the ranges represented by the coefficients of the first and second filters 201, 203, the LMS update information is not amplified by the first shift register 273 nor is there attenuation by the second shift register 272.

Because the LMS cross correlator 230 receives a signal containing a full echo component, it initially provides information corresponding to coarse, or low resolution echo signal components. This information is initially collected by the second filter 203, and is periodically transferred to the first filter 201 as previously described. Consequently, the coefficients of the first filter 201 accumulate the coarse echo information. As the coefficients of the first and second filters 201, 203 accumulate echo information, they become more effective in cancelling out the echo component contained in the digitized microphone input signal 226. This results in greater stability allowing the arrangement to adjust its configuration to extend its resolution range to additionally correct finer echo signal components.

An exemplary application of the invention has been described in the context of facilitating echo cancellation. However, one skilled in the art will readily appreciate and recognize that a filtering apparatus or method of operation in accordance with the invention can be applied in any scenario requiring high resolution filtering. Applications normally requiring double precision arrangements or high precision filtering are well suited for employment of the present invention. Applications in various disciplines which utilize signal processing are deemed ripe for application of the present invention. These include, but are not limited to, signal processing applications in hi-fidelity audio systems, communication systems, testing systems, and control systems. The invention provides the benefit of higher resolution and, therefore, better performing filters without suffering from the increased number of calculations needed for double precision arithmetic that is required in conventional solutions.

The invention has been described with reference to particular embodiments. However, it will be readily apparent to those skilled in the art that it is possible to embody the invention in specific forms other than those of the preferred embodiments described above. An exemplary application of the invention described herein discloses the use of hardwired 16-bit filters. However, it also is possible to embody the invention in other ways, such as a running program in a general purpose computer or processor. Manipulation of coefficients, calculations and adaptation can be administered by programmed processes. Embodiment of the invention in such a way may be done without departing from the spirit of the invention.

Therefore, the preferred embodiments described herein are merely illustrative and should not be considered restrictive in any way. The scope of the invention is given by the appended claims, rather than by the preceding description, and all variations and equivalents which fall within the range of the claims are intended to be embraced therein.

What is claimed is:

1. An apparatus for filtering an input signal, comprising:

first filtering means for generating a first filtered signal as a function of the input signal and a plurality of first coefficients having a first resolution range, wherein the first filtering means comprises:

means for receiving the plurality of first coefficients; and means for generating a plurality of coefficient output signals in correspondence with the plurality of first coefficients, wherein each of the coefficient output signals represents a number, n, of most significant digits of a corresponding one of the plurality of first coefficients;

second filtering means for generating a second filtered signal as a function of the input signal and a plurality of second coefficients having a second resolution range, wherein the second filtering means comprises:

means for receiving the plurality of coefficient output signals from the first filtering means; and means for modifying the plurality of second coefficients by combining each of the plurality of received coefficient output signals with a least significant n-digit portion of a corresponding one of the plurality of second coefficients;

means for scaling the first filtered signal by an amount that is a function of the number n, thereby generating a scaled signal; and means for combining the second filtered signal with the scaled signal.

2. The apparatus of claim 1, further comprising means for adjusting the number n, thereby changing a resolution range of the filtering apparatus.

3. The apparatus of claim 1, wherein, in the first filtering means, the means for receiving the plurality of first coefficients comprises:

means for receiving a plurality of coefficient update signals; and means for modifying the plurality of first coefficients by combining each of the plurality of received coefficient update signals with a corresponding one of the plurality of first coefficients.

4. The apparatus of claim 1, wherein the first filtering means further comprises means for resetting the n most significant digits of each of the first coefficients after the second filtering apparatus has received the plurality of coefficient output signals.

5. An adaptive filter apparatus comprising:

a first filter means for filtering an input signal, wherein the first filter means has coefficients representing a first portion of a dynamic extended resolution range, the first filter means producing a first filtered signal;

a second filter means for filtering the input signal, wherein the second filter means has coefficients representing a second portion of the dynamic extended resolution range, the second filter means producing a second filtered signal;

an adaptive system for providing update information to the first and the second filter means; and means for adjusting an amount of overlap between coefficients representing the first portion and coefficients representing the second portion, thereby providing the dynamic extended resolution range.

6. The adaptive filter apparatus of claim 5, further comprising:

means for periodically updating coefficients of the first filter means with information from the adaptive system; and means for periodically updating the overlapping coefficients of the second filter means by the overlapping coefficients of the first filter means.

7. The adaptive filter apparatus claimed in claim 5 wherein the first and second filter means are digital impulse response filters.

8. The adaptive filter apparatus claimed in claim 5 wherein the adaptive system is an LMS cross correlator.

9. The adaptive filter apparatus of claim 5, further comprising means for adding respective outputs from the first and second filters to an output signal to perform a correction on the output signal.

10. The adaptive filter apparatus claimed in claim 5 wherein the input signal is a radio signal generated by a radio receiver.

11. The adaptive filter apparatus claimed in claim 9 wherein the output signal is an audio signal generated within a hands-free communications environment.

12. The adaptive filter apparatus of claim 5 wherein the means for adjusting an amount of overlap operates to extend the resolution range of the apparatus when the apparatus is sufficiently stable.

13. The adaptive filter apparatus of claim 5 wherein the means for adjusting an amount of overlap operates to contract the resolution range of the apparatus when the apparatus is sufficiently unstable.

14. A method for correcting an output signal using an apparatus which includes a first filter for filtering an input signal, wherein the first filter has coefficients representing a first portion of an extended resolution range; a second filter for filtering the input signal, wherein the second filter has coefficients representing a second portion of the extended resolution range, wherein the coefficients of the first and second filters adjustably overlap; and an adaptation device for providing update information to the first and second filters, the adaptation device including means for updating the second filter coefficients as a function of an overlapping portion of the first filter coefficients; the method comprising the steps of:

acquiring an output signal which is to be corrected;

subtracting a first estimate signal produced by the second filter from the input signal to produce a first error signal;

subtracting a second estimate signal produced by the first filter from the first error signal to produce a second error signal;

monitoring the second error signal with the adaptation device to produce update information corresponding to an error remaining in the second error signal;

providing the update information to the first filter for modification of its coefficients; and periodically updating overlapping coefficients of the second filter with information from the overlapping coefficients of the first filter.

15. The method claimed in claim 14, further comprising the step:

scaling the second estimate signals in accordance with an amount of overlap to return the second estimate signal to a magnitude corresponding to the output signal.

16. The method as claimed in claim 14 further comprising the step of:

resetting the overlapping coefficients of the first filter after the step of updating the overlapping coefficients.

17. The method as claimed in claim 14 further comprising the step of:

extending or contracting the resolution range by respectively reducing or increasing an amount of overlap in the coefficients of the first and second filters.

18. The method as claimed in claim 17 wherein extending the resolution range is performed when a predetermined amount of adaptation has occurred.

19. The method as claimed in claim 17 wherein the contracting of the resolution range is performed in response to an overflow of the first filter coefficients.

20. A method for cancelling an echo in a signal received from a hands-free communication environment, the method comprising the steps of:

receiving an input signal from the hands-free environment;

subtracting a first echo estimate signal from the input signal to provide a first error signal, which first echo estimate signal is generated by a first filter having first filter coefficients representing a first portion of an extended resolution range;

subtracting a second echo estimate signal from the first corrected signal to provide a second error signal, which second echo estimate signal is generated by a second filter having second filter coefficients representing a second portion of the dynamic resolution range, wherein the first portion and the second portion of the extending resolution range are adjustably overlapping;

monitoring the second error signal to produce update information corresponding to a remaining echo signal contained in the second error signal;

updating coefficients of the second filter with the update information; and periodically updating overlapping coefficients of the first filter with overlapping coefficients of the coefficients of the second filter.

21. A method for dynamically adjusting an extended resolution range of an adaptive filter system, which adaptive filter system includes a first filtering means having coefficients which represent a first portion of the extended resolution range; a second filtering means having coefficients which represent a second portion of the extended resolution range; and an adaptive mechanism for updating coefficients of the second filtering means, wherein coefficients of the first and the second filtering means at least partially overlap; the method comprising the steps of:

a) receiving an input signal;

b) using the first filtering means to generate a first estimate signal;

c) subtracting the first estimate signal from to the input signal to produce a first error signal;

d) using the second filtering means to generate a second estimate signal;

e) subtracting the second estimate signal from the first error signal to produce a second error signal;

f) monitoring the second error signal with the adaptive mechanism to provide update information;

g) providing the update information to the second filtering means;

h) determining if an overflow occurs in the second filtering means and making an indication of the overflow;

i) increasing a degree of overlap between the coefficients of the first and the second filtering means if overflow is indicated and then repeating steps a) through h); and j) updating coefficients of the second filtering means with the update information.

22. The method as claimed in claim 21, further comprising the step of:

k) reducing the degree of overlap between the coefficient of the first and the second filtering means if overflow is not indicated.

23. The method as claimed in claim 21, further comprising the step of:

l) updating overlapping coefficients of the first filtering means with overlapping coefficients of the second filtering means.

24. An apparatus for filtering an input signal comprising:

first filtering means having first coefficients representing a first portion of an extended resolution range, the first filtering means receiving the input signal and producing a first signal that is a function of the first coefficients and the input signal;

second filtering means having second coefficients representing a second portion of the extended resolution range, the second filtering means receiving the input signal and producing a second signal that is a function of the second coefficients and the input signal; and means for adaptively updating coefficients of the first and second filtering means; and means for variably shifting the second coefficients relative to the first coefficients to dynamically adjust the extended resolution range, wherein the first coefficients represent a most significant portion of the extended range and the second coefficients represent a least significant portion of the extended range.

25. The apparatus as claimed in claim 24 further comprising means for scaling information for adaptively updating the second coefficients in accordance with a degree of offset between the second coefficients and the first coefficients; and means for scaling an output of the second filtering means according to the degree of offset to produce the second signal.

* * * * *